(12) United States Patent
Tomita et al.

(10) Patent No.: US 6,362,490 B1
(45) Date of Patent: Mar. 26, 2002

(54) ION IMPLANTER

(75) Inventors: Hiroyuki Tomita; Kazuo Mera, both of Hitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/266,738

(22) Filed: Mar. 12, 1999

(30) Foreign Application Priority Data

Mar. 13, 1998 (JP) .......................................... 10-062775

(51) Int. Cl.[7] .............................................. H01J 37/304
(52) U.S. Cl. ................... 250/492.21; 250/397; 250/251
(58) Field of Search .......................... 250/492.21, 251, 250/298, 397

(56) References Cited

U.S. PATENT DOCUMENTS

| | | | | |
|---|---|---|---|---|
| 2,599,166 A | * | 6/1952 | Dempster | 250/298 |
| 4,564,758 A | | 1/1986 | Slodzian et al. | 250/309 |
| 4,818,872 A | | 4/1989 | Parker et al. | 250/309 |
| 4,939,360 A | * | 7/1990 | Sakai | 250/251 |
| 5,136,171 A | * | 8/1992 | Leung et al. | 250/492.21 |
| 5,396,076 A | * | 3/1995 | Kimura | 250/492.21 |

FOREIGN PATENT DOCUMENTS

| | | | | |
|---|---|---|---|---|
| JP | 63-257175 | 10/1988 | | |
| JP | 3-194841 | 8/1991 | | |
| JP | 04 124267 | 4/1992 | | |
| JP | 4-160748 A | * | 6/1992 | 250/492.21 |
| JP | 8-96744 | 4/1996 | | |

OTHER PUBLICATIONS

Goldstein et al., Practical Electron Microscopy, 1975, Plenum Press, pp. 22–23.*

* cited by examiner

Primary Examiner—Jack Berman
(74) Attorney, Agent, or Firm—Mattingly, Stanger & Malur, P.C.

(57) ABSTRACT

In an ion implanter, in order to direct an ion beam from an ion generation source toward a silicon wafer to implant ions into the wafer, a filament as an electron source is heated to emit electrons and then electrons are converted to an electron beam. At this time, a magnetic field is applied from a magnetic circuit to both of the electron beam and a tungsten ion beam of tungsten ions emitted therefrom together with electrons to deflect the both beams depending on their masses and to separate the both beams into the electron beam and tungsten ion beam, tungsten ions in the tungsten ion beam are trapped by a silicon plate to irradiate only the electron beam onto the silicon wafer and to neutralize the silicon wafer to be charged.

5 Claims, 3 Drawing Sheets

ION IMPLANTER

BACKGROUND OF THE INVENTION

The present invention relates to ion implanters and, more particularly, to an ion implanter for separation by implanted oxygen (SiMOX) which is suitable for implantation of oxygen ions into a silicon wafer.

There has been conventionally known an ion impanter which implantes oxygen ions into a silicon wafer to form an insulating film of silicon dioxide within the silicon wafer. In this type of ion implanter, however, when oxygen ions are implanted into the silicon wafer, this causes the silicon wafer to be charged positively so that discharging takes place between the silicon wafer and a wafer holder, thus forming a discharge mark on the rear side of the silicon wafer. To avoid this, there has been employed an ion implanter of such an arrangement that, upon directing an ion beam onto a silicon wafer to implant ions into the wafer, an electron beam is also irradiated onto the silicon wafer to neutralize the silicon wafer charged by the ion beam with use of the electron beam, as disclosed in JP-A-3-194841 or JP-A-8-96744.

SUMMARY OF THE INVENTION

It is therefore an object of the present invention to provide an ion implanter which can direct only an electron beam toward a silicon wafer by separating impurity ions from electrons generated from an electron generation source.

In the prior art, since the electron beam is directed together with the ion beam toward the silicon wafer in order to neutralize the charged silicon wafer, it can be prevented that charging cause generation of particles. In the prior art, however, no consideration is paid to trapping impurities generated from a filament as an electron generation source. For this reason, impurity ions, e.g., tungsten ions, generated together with thermions from the filament are implanted together with electrons into the silicon wafer, resulting in that the silicon wafer is polluted with the metal. The metal pollution of the silicon wafer causes degradation of insulating characteristics of the wafer and therefore an involved insulation fault leads to reduction of the quality of the wafer.

The present invention solves such a problem in the prior art.

In accordance with an aspect of the present invention, the above object is attained by providing an ion implanter which comprises an ion beam generation means for directing an ion beam from an ion generation source toward a wafer, an electron beam generation means for converting electrons generated from an electron generation source into an electron beam and outputting the beam, and an electron beam irradiation means for separating the electron beam from an impurity ion beam generated from the electron beam generation means as associated with the electron beam to irradiate only the electron beam onto the wafer to cause ions in the ion beam to be implanted into the wafer.

The electron beam irradiation means in the ion implanter may be arranged to have a function of separating the electron beam generated from the electron beam generation means and the impurity ion beam generated as associated with the electron beam to trap impurity ions in the impurity ion beam and irradiating the electron beam onto the wafer, or to have a function of separating the path of the electron beam generated from the electron beam generation means and the path of the impurity ion beam generated as associated with the electron beam to trap impurity ions in the impurity ion beam and irradiating the electron beam onto the wafer.

The ion implanter may additionally include elements (1) to (11) which follow as necessary.

(1) The electron beam irradiation means applies a magnetic field to the electron beam and impurity ion beam to deflect the both beams based on their masses.

(2) The electron beam irradiation means includes a magnetic circuit which is disposed in the middle of a beam transmission path connecting said electron beam generation means and said wafer for variably changing a magnitude of the electron beam in the beam transmission path.

(3) The magnetic circuit includes a magnet for generating a magnetic field and a pair of cores disposed as opposed each other on both sides of the magnet for establishing a magnetic field from the magnet in a direction intersected with the beam transmission path, and the pair of cores are shaped into a triangle which area becomes small as it goes away from the magnet.

(4) The electron beam irradiation means applies an electrical field to the electron beam and impurity ion beam to deflect the both beams based on their masses.

(5) The electron beam irradiation means includes positive and negative electrode plates which are disposed in the middle of the beam transmission path connecting the electron beam generation means and said wafer and form a curve in the beam transmission path.

(6) A lens system for adjusting a diameter of the electron beam is provided in the beam transmission path on a side of the positive and negative electrode plates close to the wafer.

(7) The electron beam irradiation means includes a trap plate which traps impurity ions at a location intersected with the transmission path of the impurity ion beam.

(8) An anti-adhesion plate made of the same material as the wafer is fixedly mounted on the trap plate.

(9) The ion beam generation means and said electron beam irradiation means carry out irradiation and stoppage of the ion beam and electron beam synchronously respectively.

(10) The electron beam irradiation means includes a temperature detection means for detecting a temperature of the electron beam to be irradiated onto the wafer and a magnetic field adjustment means for controlling the magnitude of the magnetic field according to a detection output of the temperature detection means.

(11) The electron beam irradiation means includes a temperature detection means for detecting a temperature of the electron beam to be irradiated onto the wafer and an electrical field adjustment means for controlling the magnitude of the electrical field according to a detection output of the temperature detection means.

(12) The electron beam irradiation means includes a temperature detection means for detecting a temperature of the electron beam to be irradiated on to the wafer and a magnetic field adjustment means for controlling the magnitude of the magnetic field according to a detection output of the temperature detection means.

In the above means, before the ion beam generated from the ion generation source is irradiated onto the wafer, electrons emitted from the electron generation source are converted to the electron beam, electrons emitted from the electron generation source are separated from impurity ions emitted therefrom as associated with generation of the electrons, and only the electron beam is irradiated onto the wafer. As a result, it can be avoided that the wafer be polluted with the impurity metals and thus the insulating characteristics of the wafer be degraded, thus enabling contribution to an improvement in the quality of the wafer.

Further, in order to separate the electron beam from the impurity ion beam, the separated impurity ions are trapped to irradiate only the electron beam onto the wafer, or the path of the electron beam is separated from the path of the impurity ion beam to trap the separated impurity ions to irradiate only the electron beam onto the wafer. Thus the wafer can be neutralized without being polluted with the impurity metals, contributing to an improvement in the quality of the wafer.

As has been explained above, in accordance with the present invention, when an electron beam is directed together with an ion beam toward a wafer, electrons are separated from impurity ions generated as associated with the electrons to direct only the electron beam toward the wafer. Therefore, the charging of the wafer can be neutralized without pollution of the wafer with the impurity metals, which contributes to an improvement in the quality of the wafer.

DESCRIPTION OF THE PREFERRED EMBODIMENTS

An embodiment of the present invention will be explained with reference to the attached drawings.

Figure 1:
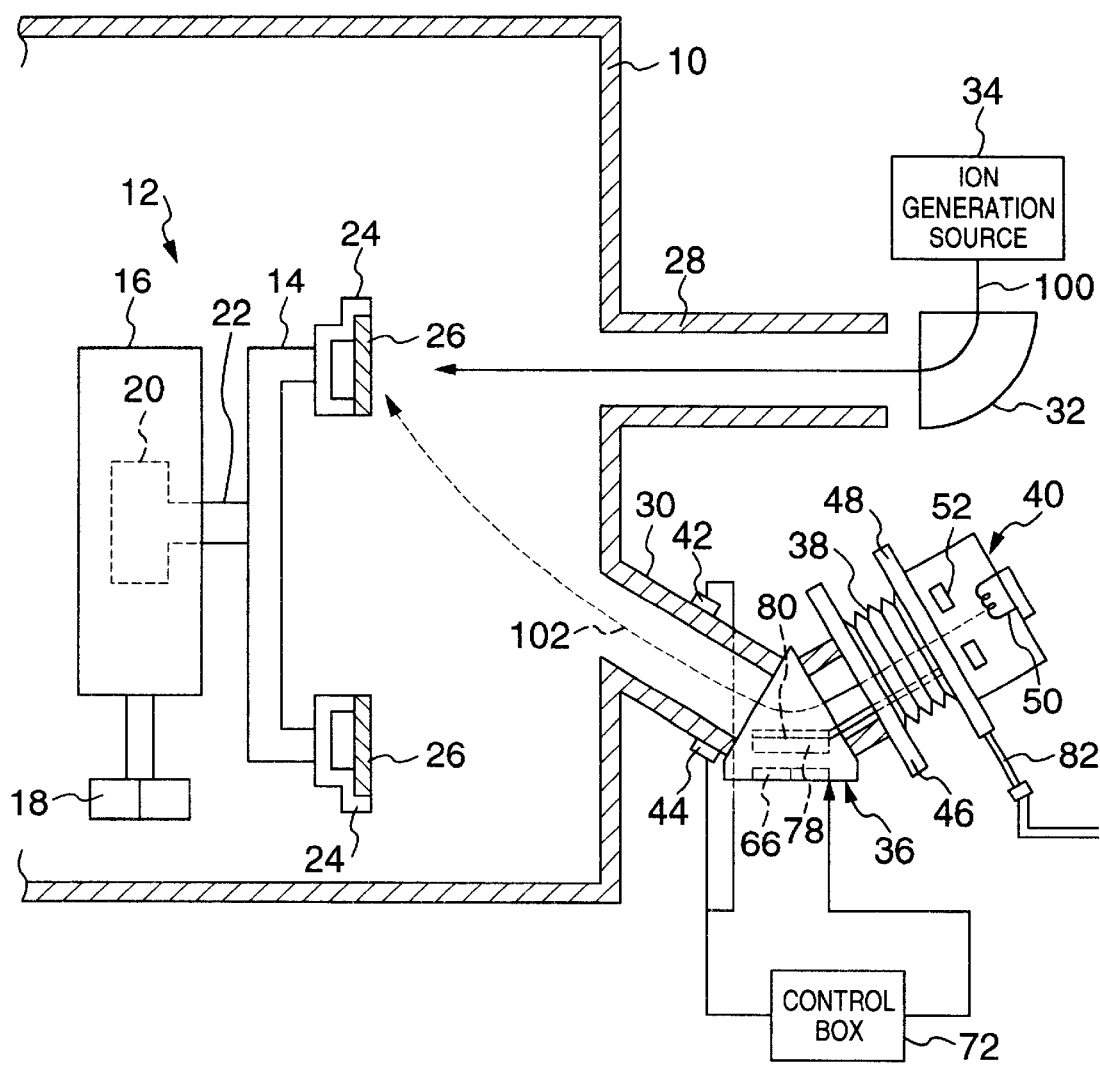
FIG. 1 is a general arrangement of an ion implanter in accordance with an embodiment of the present invention.
Figure 2:
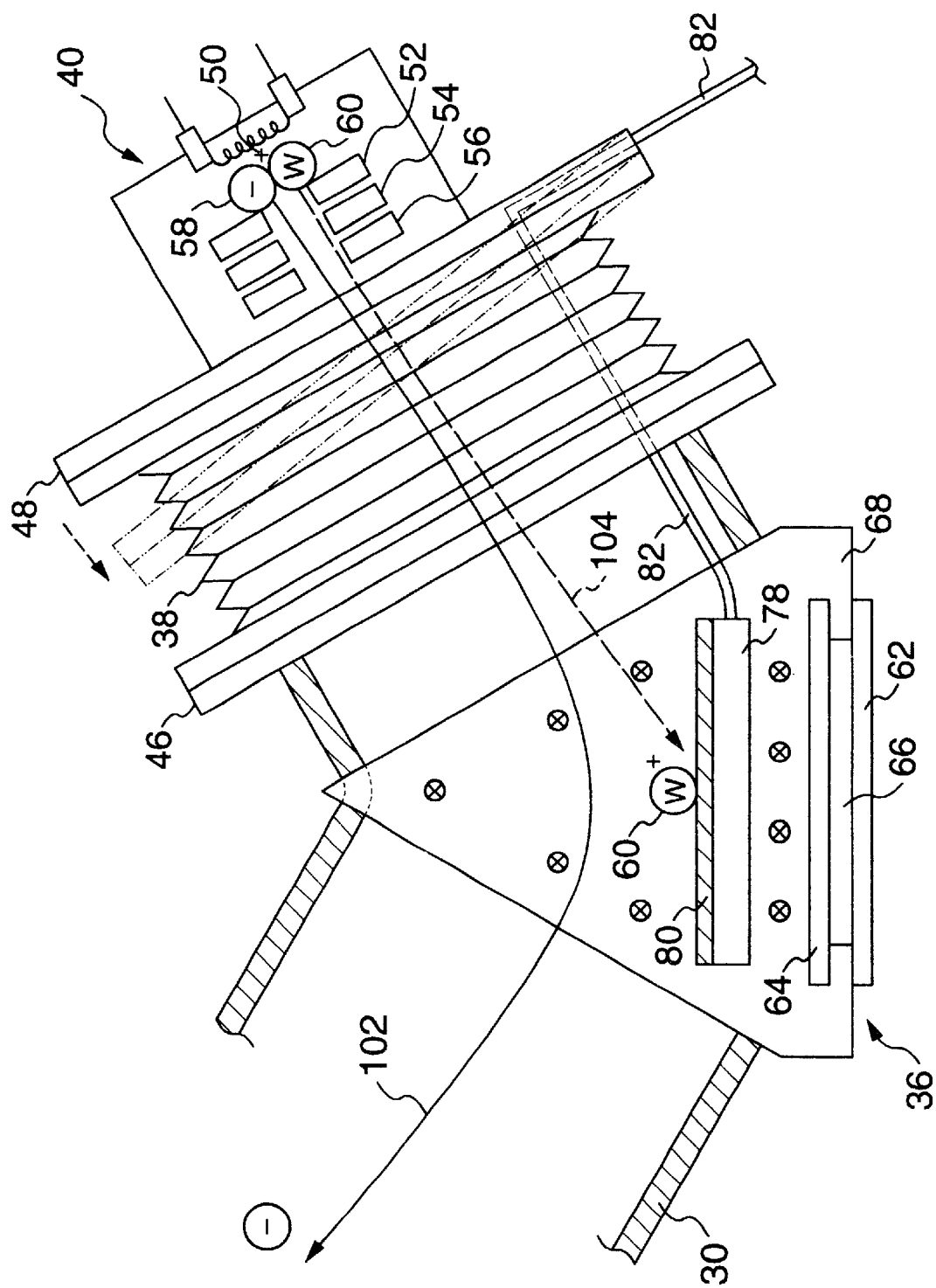
FIG. 2 is an enlarged view of a major part of the ion implanter of FIG. 1.

FIG. 1 is a general arrangement of an ion implanter for separation by implanted oxygen (SiMOX) in accordance with an embodiment of the present invention, and FIG. 2 is an enlarged view of a major part of the ion implanter of FIG. 1.

In FIGS. 1 and 2, an end station 10 forming a part of a box-shaped container contains a scan box 12 and a rotary disk 14. The scan box 12 has a main body 16 which is fixed to a base 18. Provided within the main body 16 is a rotating motor 20. The rotating motor 20 has a rotary shaft 22 which is connected to the rotary disk 14 at its central position. In other words, the rotary disk 14 is arranged to be rotated around the rotary shaft 22 by the driving rotation of the rotating motor 20. Further arranged along an outer periphery of the circular rotary disk 14 are a plurality of wafer holders 24 along its circumferential direction with an equal pitch. Held in each of the wafer holders 24 is, for example, a silicon wafer 26 as a wafer. In other words, the silicon wafers 26, which are held in the respective wafer holders 24, are arranged to be sequentially rotated around the rotary shaft 22 by the rotation of the rotary disk 14.

Meanwhile, provided in a side wall of the end station 10 are pipes 28 and 30 which form beam transmission paths. The pipe 28 is connected with an ion generation source 34 through a mass separator 32, while the pipe 30 is connected with an electron supplier 40 through a bellows 38. The ion generation source 34 generates, for example, an ion beam 100 based mainly on oxygen ions. The ion beam 100 is separated by the mass separator 32 into ions alone having a predetermined mass, which ions are formed as an ion beam 100 of mainly a single ion type to be directed toward the silicon wafer 26. That is, the ion generation source 34, mass separator 32 and pipe 28 form an ion implanting means for directing the ion beam 100 toward the silicon wafer 26 to implant ions into the wafer.

The pipe 30, which is shaped into nearly an elbow, is provided on its outer peripheral side wall with temperature sensors 42 and 44 as means for detecting a temperature within the pipe 30. The pipe 30 is also provided in its middle part with a magnetic circuit 36, and fixedly provided at its end with a flange 46. Fixedly mounted to the flange 46 through the bellows 38 is a flange 48, on which the electron supplier 40 is fixedly mounted. The bellows 38 are provided as extendable along the axial direction of the pipe 30. The pipe 30, bellows 38 and flanges 46 and 48 are made of non-magnetic materials. The electron supplier 40 has a filament 50 as a electron generation source connected to a power source, a lead electrode 52, a deceleration electrode 54 and an acceleration electrode 56. When a current flows through the filament 50, this causes the filament 50 to be heated so that heated electrons 58 are emitted from the filament 50 and the electrons 58 are drawn out by the lead electrode 52. Thereafter the electrons 58 are decelerated by the deceleration electrode 54, accelerated by the acceleration electrode 56 into an electron beam 102, and the electron beam 102 is then guided into the pipe 30. At the same time that the electrons 58 are emitted from the filament 50, impurity ions such as tungsten ions 60 in the filament 50 are also emitted therefrom. The tungsten ions 60 are also guided into the pipe 30 as a tungsten ion beam 104. That is, the filament 50, lead electrode 52, deceleration electrode 54 and acceleration electrode 56 form a electron beam generation means for converting the electrons 58 emitted from the electron generation source into the electron beam 102 and outputting the electron beam. The electron beam 102 and tungsten ion beam 104 guided into the pipe 30 are deflected and separated by the magnetic circuit 36 depending on their masses, so th at only the electron beam 102 is irradiated onto the silicon wafer 26. That is, the magnetic circuit 36 and pipe 30 form an electron beam irradiating means for directing the electron beam 102 onto the silicon wafer 26.

Figure 3:
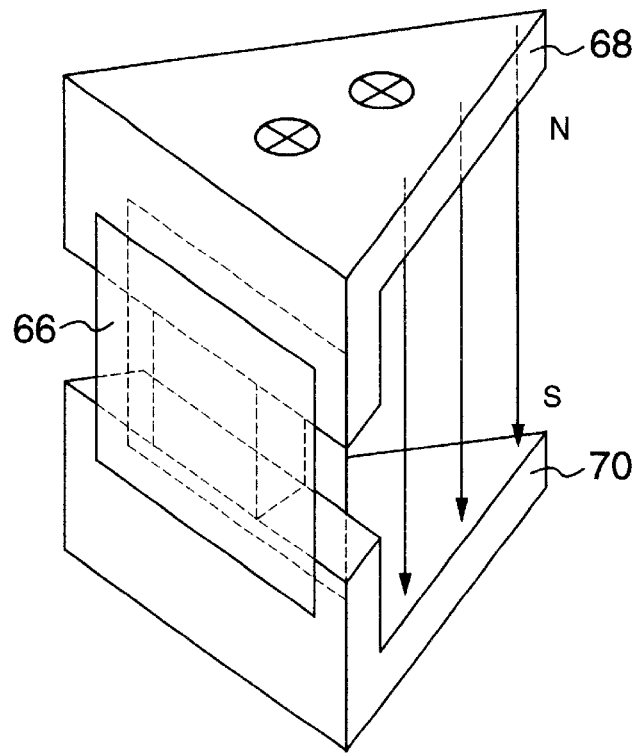
FIG. 3 is a perspective view of a configuration of a magnetic circuit.
Figure 4:
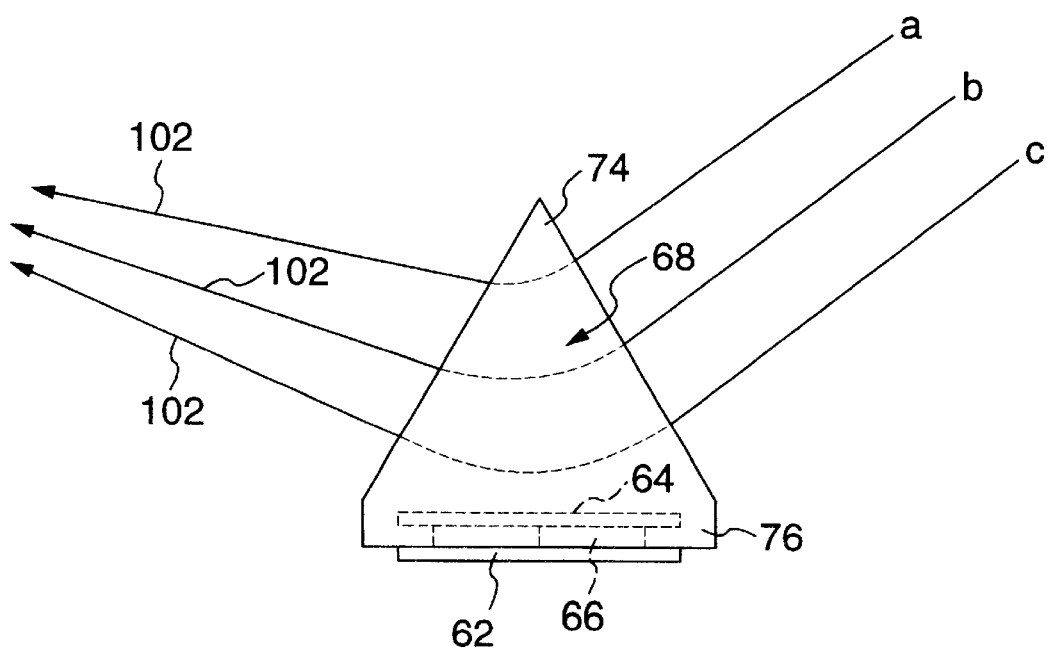
FIG. 4 is a view for explaining a relationship between an electron beam and the magnetic circuit.

More in detail, the magnetic circuit 36, as shown in FIGS. 3 and 4, includes a pair of magnetic field adjusting plates 62 and 64, an electromagnet 66 disposed between the magnetic field adjusting plates 62 and 64, and L-shaped iron plates (cores) 68 and 70. The electromagnet 66 is connected to a control box 72 as a magnetic field adjusting means. The iron plates 68 and 70 are fixed to both sides of the magnetic field adjusting plates 62 and 64 as opposed each other with the pipe 30 disposed therebetween, so that a magnetic field generated by the electromagnet 66 is established within the pipe 30. The intensity (magnitude) of the magnetic field is adjusted by a current flowing through the electromagnet 66. In the present embodiment, the current flowing through the electromagnet 66 is controlled by the temperature detected by the temperature sensors 42 and 44, and the intensity of the magnetic field is adjusted by the magnitude of the current.

In the present embodiment, further, the magnetic field formed on the side of the magnetic field adjusting plate 62 may be strengthened to establish a weak magnetic field within the pipe 30 by making large the thickness of one 62 of the magnetic field adjusting plates 62 and 64; or the magnetic field formed on the side of the magnetic field adjusting plate 62 may be weakened to establish a strong magnetic field within the pipe 30 by making small the thickness of magnetic field adjusting plate 62.

In the present embodiment, furthermore, the upper and lower surfaces of the iron plates 68 and 70 are shaped into a triangle, on which apex 74 and bottom side 76 the electron beam 102 passed between the iron plates 68 and 70 are different in their passage lengths. As a result, the strength of the magnetic field subjected by the electromagnet 66 is different depending on the positions of the electron beam 102. In other words, since the electron beam 102 passed between the iron plates 68 and 70 as shown by a path a on the side of the apex 74 is subjected to the weaker magnetic field than the electron beam 102 (path c) passed between the iron plates on the side of the bottom side 76, which results in that the electron beam 102 passed on the side of the apex 74 has a large curvature radius in its arcuate passage. On the contrary, since the electron beam 102 passed on the side of the bottom side 76 is subjected to a strong magnetic field as shown by the path c, its curvature radius becomes small. As a result, the electron beam 102 passed through the magnetic circuit 36 becomes convergent, and the degree of the convergence can be easily adjusted by changing the shape of the cores, i.e., iron plates 68 and 70. Further, the diameter or size of the electron beam 102 can be changed by changing the thickness of the magnetic field adjusting plate 62 or by adjusting the angle of the bellows 38 to make variable the passage direction of the electron beam 102 as shown by a broken line in FIG. 2.

Also disposed within the pipe 30 is an impurity ion trap plate 78 in a zone defined by the iron plates 68 and 70 at a position intersected with the tungsten ion beam 104. The impurity ion trap plate 78 is formed therein with a circulation passage for circulation of cooling water therethrough, and also is connected with a pipe 82 for introduction of the cooling water into the trap plate and with a pipe (not shown) for discharging of the cooling water therefrom. Further fixedly mounted on the impurity ion trap plate 78 is a silicon plate 80 which is made of the same material as the silicon wafer 26. The silicon plate 80 acts to trap only tungsten ions 60 in the tungsten ion beam 104 separated by the magnetic circuit 36 and introduced into the pipe 30 simultaneously with the electron beam 102 to prevent the tungsten ions 60 from being implanted into the silicon wafer 26. When the heated tungsten ions 60 are trapped by the silicon plate 80, the silicon plate 80 is heated. However, since the silicon plate 80 is cooled by the cooling water as mentioned above, it can be avoided that the silicon plate 80 be heated and deteriorated. Further, the tungsten ions 60 are trapped by the silicon plate 80 through sputtering of the tungsten ions 60. Since the silicon plate 80 and silicon wafer 26 are made of the same material, however, impurity generation by the sputtering can be avoided.

With such an arrangement as mentioned above, when driving rotation of the motor 20 causes rotation of the rotary disk 14, the silicon wafers 26 held in the wafer holders 24 are sequentially rotated around the rotary shaft 22. At this time, the ion beam 100 (oxygen ion beam) emitted from the ion generation source 34 is irradiated onto the silicon wafer 26 to cause ions to be implanted into the wafer. In synchronism with the irradiation of the ion beam 100, the electrons 58 emitted from the filament 50 are converted to the electron beam 102, the tungsten ions 60 emitted therefrom are converted to the tungsten ion beam 104, and the both beams are guided into the pipe 30. The passage directions of the electron beam 102 and tungsten ion beam 104 guided into the pipe 30 are deflected by the magnetic field of the magnetic circuit 36 depending on the masses of the beams into the separated electron beam 102 and tungsten ion beam 104, and only the tungsten ions 60 in the tungsten ion beam 104 are trapped by the silicon plate 80.

The electron beam 102, on the other hand, is irradiated onto the silicon wafer 26 as it is without being trapped by the silicon plate 80. As a result, the charging of silicon wafer 26 can be neutralized, and particle generation involved by the charging and metal pollution of the silicon wafer 26 can be avoided. Therefore, an insulating film having a high accuracy can be formed in the silicon wafer 26, contributing to an improvement in the quality of the silicon wafer 26.

Further, when the ion beam 100 and electron beam 102 are irradiated onto the silicon wafer 26, the irradiation or stoppage of the ion beam 100 and electron beam 102 are carried out synchronously, whereby the neutralization of the charged silicon wafer 26 can be reliably realized.

Although the electron emission has been made from the filament 50 in the foregoing embodiment, an electron gun for emitting primary electrons or a plasma flood gun for emitting electrons from a plasma source may be instead employed. Also usable is a gun for emitting secondary electrons.

Though the separation between the electron beam and impurity ion beam has been carried out by applying the magnetic field to the both beams and separating the beams based on their masses, i.e., utilizing a difference between the masses in the beams in the foregoing embodiment, further, there may be employed such an arrangement that an electrical field is applied to the electron and impurity ion beams to separate the beams depending on their masses.

More specifically, the electron beam and impurity ion beam may be separated each other depending on their masses by providing, in place of the magnetic circuit 36, positive and negative electrode plates forming a curve in the beam transmission path in the middle of the pipe 30 forming the beam transmission path to apply an electrical field to the beams from the electrode plates. In this case, additional positive and negative electrode plates as a lens system for adjustment of the diameter of the electron beam may be provided in the beam transmission path on the wafer side of the first-mentioned positive and negative electrode plates. In this connection, further, the magnitude of the electrical field, that is, the magnitude of a voltage to be applied to the positive and negative electrode plates may be adjusted or the magnitude of an electrical field in the lens system may be adjusted, based on the temperature detected by the temperature sensors 42 and 44.

What is claimed is:

1. An ion implanter comprising:
    ion beam generation means for directing an ion beam from an ion generation source toward a wafer;
    electron beam generation means for converting electrons generated from an electron generation source into an electron beam and outputting the beam; and
    electron beam irradiation means for separating the electron beam from an impurity ion beam generated from the electron beam generation means as associated with the electron beam to irradiate only the electron beam onto the wafer to cause ions in the ion beam to be implanted into the wafer;
    wherein said electron beam irradiation means applies a magnetic field to the electron beam and impurity ion beam to deflect the both beams depending on masses thereof; and
    wherein said electron beam irradiation means includes temperature detection means for detecting a temperature of a pipe within which said electron beam is to be directed toward said wafer and magnetic-field adjustment means for controlling a magnitude of the magnetic field based on a detection output of said temperature detection means.

2. An ion implanter comprising:

ion beam generation means for directing an ion beam from an ion generation source toward a wafer;

electron beam generation means for converting electrons generated from an electron generation source into an electron beam and outputting the beam; and electron beam irradiation means for separating the electron beam from an impurity ion beam generated from the electron beam generation means as associated with the electron beam to irradiate only the electron beam onto the wafer to cause ions in the ion beam to be implanted into the wafer;

wherein said electron beam irradiation means applies an electrical field to the electron beam and impurity ion beam to deflect the both beams depending on masses thereof, and wherein said electron beam irradiation means includes temperature detection means for detecting a temperature of a pipe through which said electron beam is directed toward said wafer and magnetic-field adjustment means for controlling a magnitude of the magnetic field based on a detection output of said temperature detection means.

3. An ion implanter comprising:

ion beam generation means for directing an ion beam from an ion generation source toward a wafer;

electron beam generation means for converting electrons generated from an electron generation source into an electron beam and outputting the beam; and electron beam irradiation means for separating the electron beam from an impurity ion beam generated from the electron beam generation means as associated with the electron beam to irradiate only the electron beam onto the wafer to cause ions in the ion beam to be implanted into the wafer;

wherein said electron beam irradiation means applies an electrical field to the electron beam and impurity ion beam to deflect the both beams depending on masses thereof; and wherein said electron beam irradiation means is disposed in the middle of a beam transmission path connecting said electron beam generation means and said wafer and includes positive and negative electrode plates which form a curve in said beam transmission path;

wherein a lens system for adjusting a diameter of said electron beam is provided in said beam transmission path on a side of said positive and negative electrode plates closer to said wafer;

wherein said electron beam irradiation means includes temperature detection means for detecting a temperature of a pipe through which said electron beam is directed toward said wafer, magnetic field adjustment means for controlling a magnitude of the electrical field based on a detection output of said temperature detection means, and lens system adjustment means for controlling a magnitude of an electrical field of said lens system based on the detection output of said temperature detection means.

4. An ion implanter comprising:

ion beam generation means for directing an ion beam from an ion generation source toward a wafer;

electron beam generation means for converting electrons generated from an electron generation source into an electron beam and outputting the beam; and electron beam irradiation means for separating the electron beam from an impurity ion beam generated from the electron beam generation means as associated with the electron beam to irradiate only the electron beam onto the wafer to cause ions in the ion beam to be implanted into the wafer;

wherein said electron beam irradiation means separates the electron beam emitted from said electron beam generation means and the impurity ion beam emitted as associated with said electron beam to trap impurity ions in the impurity ion beam and irradiates the electron beam onto said wafer, and wherein said electron beam irradiation means includes a trap plate located at a position intersected with the transmission path of the impurity ion beam for trapping impurity ions;

wherein said electron beam irradiation means includes temperature detection means for detecting a temperature of a pipe through which said electron beam is to be directed toward said wafer and electric field adjustment means for controlling a magnitude of the electric field based on a detection output of said temperature detection means.

5. An ion implanter, wherein a lens system for adjusting a diameter of said electron beam is provided in said beam transmission path on a side of said positive and negative electrode plates closer to said wafer;

wherein said electron beam irradiation means includes temperature detection means for detecting a temperature of a pipe through which said electron beam is to be directed toward said wafer and magnetic-field adjustment means for controlling a magnitude of the magnetic field based on a detection output of said temperature detection means, and lens system adjustment means for controlling a magnitude of an electric field of said lens system based on the detection output of said temperature detection means.

* * * * *